United States Patent [19]

Schwalm et al.

[11] Patent Number: 5,039,595
[45] Date of Patent: Aug. 13, 1991

[54] AQUEOUS DEVELOPER SOLUTION HAVING HYDROXY-ALKYL PIPERIDINE FOR POSITIVE-WORKING PHOTORESISTS

[75] Inventors: Reinhold Schwalm, Wachenheim; Horst Binder, Lampertheim, both of Fed. Rep. of Germany

[73] Assignee: BASF Aktiengesellschaft, Ludwigshafen, Fed. Rep. of Germany

[21] Appl. No.: 391,253

[22] Filed: Aug. 9, 1989

[30] Foreign Application Priority Data

Aug. 13, 1988 [DE] Fed. Rep. of Germany ....... 3827567

[51] Int. Cl.$^5$ .............................. G03C 5/30
[52] U.S. Cl. .................... 430/326; 430/192; 430/193; 430/270; 430/331
[58] Field of Search ............... 430/331, 326, 192, 193, 430/270

[56] References Cited

U.S. PATENT DOCUMENTS

| | | | |
|---|---|---|---|
| 4,192,929 | 3/1980 | Wingfield, Jr. ............ | 525/118 |
| 4,576,903 | 3/1986 | Baron et al. . | |
| 4,820,621 | 4/1989 | Tanka et al. ............ | 430/331 |
| 4,833,067 | 5/1989 | Tanaka et al. ............ | 430/331 |
| 4,863,828 | 10/1989 | Kawabe et al. ............ | 430/191 |
| 4,877,719 | 10/1989 | Higashi et al. ............ | 430/331 |
| 4,929,605 | 5/1990 | Domet et al. ............ | 424/465 |

FOREIGN PATENT DOCUMENTS

| | | |
|---|---|---|
| 0080042 | 6/1983 | European Pat. Off. . |
| 0124297 | 11/1984 | European Pat. Off. . |
| 0231028 | 8/1987 | European Pat. Off. . |
| 0336400 | 10/1989 | European Pat. Off. . |
| 2193335 | 2/1988 | United Kingdom . |
| 87/07039 | 11/1987 | World Int. Prop. O. . |

OTHER PUBLICATIONS

Novolac Resins Used in Positive Resist Systems, T. R. Pampalone, Solid State Technology, Jun. 1984, pp. 115–120.
Evaluation of Pure Novolak Cresol-Formaldehyde Resins for Deep U.V. Lithography, Gipstein et al., J. Chem. Soc. Jan. 1982, 201–205.
Aldrich Chemical Catalog p. 1065.

*Primary Examiner*—Charles L. Bowers, Jr.
*Assistant Examiner*—John S. Y. Chu
*Attorney, Agent, or Firm*—Keil & Weinkauf

[57] ABSTRACT

An aqueous developer solution contains, as a water-soluble basic compound, a compound of the general formula (I)

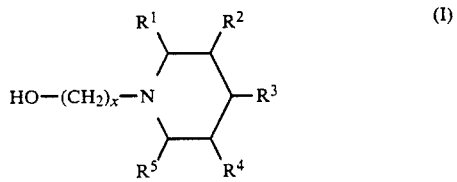

where $R^1$ to $R^5$ are identical or different and are each H, OH, hydroxyalkyl, alkoxy or alkyl.

It is suitable for developing positive-working photoresists.

5 Claims, No Drawings

AQUEOUS DEVELOPER SOLUTION HAVING HYDROXY-ALKYL PIPERIDINE FOR POSITIVE-WORKING PHOTORESISTS

The present invention relates to an aqueous developer solution for positive-working photoresists, based on an aqueous solution of certain basic compounds which have excellent properties with regard to contrast, wall slope and resolution, and a method for development.

For the selective modification of small areas in a substrate, photoresists are used as an auxiliary layer in semiconductor technology. Positive-working photoresists are preferably used for this purpose. With the aid of the photoresists, it is possible to produce relief images which leave the surface to be modified exposed in certain areas and thus make it accessible to further treatment, such as doping or metallization.

Positive resist images are produced by applying a layer of a photosensitive material to a silicon wafer and then exposing it through a structured mask and selectively dissolving away the exposed parts in the development process.

Conventional photosensitive compositions are those consisting of alkali-soluble resins, for example of the novolak type, and a photosensitive component, for example an o-quinonediazide. The solubility of the composition in alkaline developers in the exposed parts is dramatically increased by the action of UV light.

Conventional developers are aqueous alkaline solutions based on sodium hydroxide, potassium hydroxide or sodium silicate. A number of developers which are free of metal ions and are based on ammonium hydroxides, such as tetramethylammonium hydroxide or tetraethylammonium hydroxide, are likewise known (cf. for example EP-A-124 297). To improve the contrast of these systems, for example, surfactants have been added, in general quaternary ammonium surfactants in combination with ammonium hydroxide developers or fluorinated nonionic surfactants in combination with alkali metal hydroxide developers (cf. EP-A-146 834 and EP-A-231 028). These surfactants give high contrast but the reproducibility in the immersion development process is poor since the surfactants are rapidly consumed and the stability of the developer is therefore adversely affected.

An aqueous alkaline developer which both permits high contrast and has sufficient stability is therefore desirable.

It is an object of the present invention to provide a developer for positive photoresists which permits high contrast, high resolution and good structural quality and has improved properties with regard to stability and development capacity.

We have found that this object is achieved and that, surprisingly, a developer for positive resists which is based on an aqueous solution of hydroxyalkylpiperidine has excellent development properties and sufficient stability.

The present invention relates to an aqueous developer solution for positive-working photoresists which contains a water-soluble basic compound, wherein the said compound is a compound of the general formula (I)

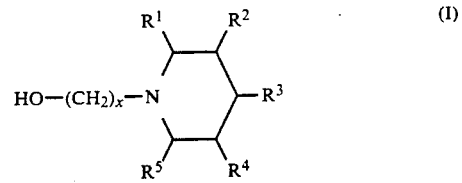

where $R^1$ to $R^5$ are identical or different and are each H, OH, hydroxyalkyl of 1 to 4 carbon atoms, alkoxy of 1 to 4 carbon atoms or alkyl of 1 to 4 carbon atoms and x is from 1 to 5.

This developer solution may additionally contain a nonionic surfactant. The novel developer solution contains in general from 5 to 50, preferably from 10 to 40, % by weight, based on the total amount of the developer solution, of a compound of the formula (I). Particularly preferred hydroxyalkylpiperidines of the general formula (I) are N-hydroxymethyl-, N-hydroxyethyl- and N-hydroxypropylpiperidine.

The present invention furthermore relates to a method for developing a positive-working photoresist based on novolak/o-quinonediazide, the resist being applied to a substrate, exposed imagewise and brought into contact with developer solution to form the positive resist image, and the developer solution used being a novel aqueous developer solution, and a method for developing a positive-working photoresist based on poly-(p-hydroxystyrene)/sulfonium salt, a similar process being adopted with the use of the novel developer solution.

The developer solutions according to the invention have improved stability and development capacity. They therefore make it possible to achieve excellent properties with regard to contrast, wall slope and resolution.

The novel developer can be used in principle to develop all positive photoresist materials which are essentially based on mixtures of phenolic resins, as the base-soluble matrix, and a photosensitive component. Such materials are, for example, the known positive resists based on novolaks and compounds of the naphthoquinonediazide type.

An overview of the use of novolaks in positive resists is given by T. Pampalone in Solid State Technology, June 1984, pages 115–120. The use of novolaks based on p-cresol/formaldehyde resins for deep UV lithography is described by E. Gipstein in J. Electrochem. Soc. 129 1, (1982), 201–205.

Particularly suitable is the developer for positive resists, based on the systems described in DE-A-37 21 741 and consisting of phenolic polymers and onium salts having acid-labile groups.

Preferred onium salts are sulfonium salts of the general formula (II)

where $R^1$ to $R^3$ are identical or different and may each contain aromatic and/or aliphatic radicals which may contain heteroatoms, with the proviso that one or more of the radicals $R^1$ to $R^3$ contains an acid-cleavable group, for example a tert-butyl carbonate of a phenol or a silyl ether of a phenol. The abovementioned acid-labile groups are preferred, but a large number of other acid-labile groups, such as the known tetrahydropyranyl ethers, ortho esters, trityl and benzyl groups and tert-butyl esters of carboxylic acids, may also be used. It is also possible for two or more sulfonium units in the molecule to be linked via the radicals $R^1$ to $R^3$.

Preferred counter-ions $X^\ominus$ are complex metal halides, such as tetrafluoborate, hexafluoroantimonate, hexafluoroarsenate and hexafluorophosphate.

The phenolic polymers contain, as a rule, units of the general formula (III)

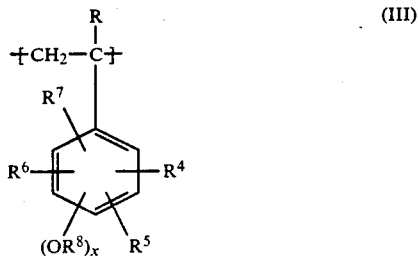

where R is hydrogen, halogen or alkyl of 1 to 4 carbon atoms, $R^4$, $R^5$, $R^6$ and $R^7$ are each hydrogen, halogen or alkyl or alkoxy, each of 1 to 4 carbon atoms, $R^8$ is hydrogen or an acid-labile group, such as trimethylsilyl, tert-butoxycarbonyl, isopropoxycarbonyl or tetrahydropyranyl, and x is from 1 to 3, preferably 1.

Preferred polymers of the formula (III) are those where R is hydrogen or methyl and $R^4$ to $R^7$ are each hydrogen and the radicals $R^8$ are hydrogen and/or an acid-labile group having one of the abovementioned meanings, $-O-R^8$ being in the p-position and the proportion of groups where $R^8$ is hydrogen being not less than 70 mol %.

These polymers generally have mean molecular weights ($\overline{M}_n$) of from 1,000 to 250,000, preferably from 10,000 to 80,000, and are generally present in the radiation-sensitive mixture in an amount of from 40 to 98, preferably from 60 to 95, % by weight.

Mixtures of alkali-soluble polymers which have a high content of aromatic groups, i.e. novolaks and substituted poly-(p-hydroxystyrenes), can also advantageously be used as polymeric binders. Binders having a high aromatic content have the advantage that they are relatively stable in plasma etching processes and reactive ion etching processes.

For the special application in deep UV lithography, it may be necessary for the radiation-sensitive mixture to contain both a phenolic polymer based on polyvinylphenol and a novolak of the p-cresol/formaldehyde type, or predominantly o,o'-bonded phenol/formaldehyde, since one of these components alone frequently does not provide all the desired properties.

The novel developer is also suitable for positive resists based on 3-component systems, consisting of an alkali-soluble binder, a compound which forms a strong acid when exposed to actinic radiation and a compound having one or more C—O—C bonds cleavable by an acid, as described in, for example, DE-A-3406927.

The novel process for producing resist images is carried out in a known manner but with the use of the novel developer. For this purpose, the mixtures of phenolic resin and/or phenolic polymer and photosensitive component are generally dissolved in an organic solvent, the solids content being from 5 to 40% by weight. Preferred solvents are aliphatic ketones, ethers and esters, and mixtures of these. Alkylene glycol monoalkyl ethers, for example ethylcellosolve, butyglycol, methylcellosolve and 1-methoxy-2-propanol, alkylene glycol alkyl ether esters, for example methylcellosolve acetate, ethylcellosolve acetate, methylpropylene glycol acetate and ethylpropylene glycol acetate, ketones, for example cyclohexanone, cyclopentanone and methyl ethyl ketone, acetates, such as butyl acetate, and aromatics, such as toluene and xylene, are particularly preferred. The choice of the appropriate solvents and mixtures of these solvents depends on the choice of the particular phenolic polymer, novolak and photosensitive component.

Other additives, such as adhesion promoters, wetting agents, dyes and plasticizers, may also be added.

Small amounts of sensitizers may, if necessary, also be added in order to sensitize the compounds in the relatively long-wavelength UV to the visible range. Polycyclic aromatics, such as pyrene and perylene, are preferred, but it is also possible to use other dyes which act as sensitizers.

The homogeneous solution of the photosensitive mixture can be applied in a conventional manner, for example by spin coating, to the substrate to be coated, in general to a silicon wafer oxidized on the surface, so that a photosensitive layer having a thickness of about 1-2 μm is obtained, and can be heated at from 60° to 120° C. By imagewise exposure with the aid of a structured mask, suitable light sources being, for example, high pressure mercury lamps or excimer lasers, a latent image is produced in the photosensitive layer. Before the development step, a postexposure bake can, if required, also be carried out, at from 60° to 120° C. For the novolak/o-quinonediazide systems, this postexposure bake is carried out in some cases to reduce the effects due to standing waves; in the case of systems based on poly-(p-hydroxystyrene)/sulfonium salt, however, a postexposure bake at from 60° to 120° C. is essential. By bringing the photosensitive layer treated in this manner in contact with the novel developer, either by immersion in the developer solution or by spraying with developer, the latent image is developed into a relief image.

In general, it is not necessary to add surfactants to the novel developer solution. However, such substances may be added in general in amounts of not more than 5% by weight, based on the total amount of the developer solution, for example nonylphenoxypoly-(ethyleneoxy)-ethanol, octylphenoxypoly-(ethyleneoxy)-ethanol or commercial fluorinated surfactants.

After the treatment with the novel developer solution, the relief produced is dried and then serves as the mask for the further treatment steps, such as etching of the substrate.

The novel developer has excellent properties with regard to the resolution to be achieved (less than 1 μm) and wall slope, permits high sensitivity of the resist to short-wavelength UV radiation, has good development capacity and stability and is therefore ideal for microlithography for the production of semiconductor components.

In the Examples which follow, parts and percentages are by weight, unless stated otherwise.

EXAMPLE 1

A commercial positive resist based on novolak/naphthoquinonediazide was applied to surface-oxidized silicon wafers by spin coating, in such a way that, after the wet polymer layer had been dried at 90° C. on a hot plate, 1 μm thick resist layers resulted. The wafers were then exposed in a contact exposure unit through a chromium-coated quartz plate having variable transmission areas and were developed in the downstream development process at 21° C. in 40% strength N-(2-hydroxyethyl)-piperidine solution, the exposed photoresist parts being dissolved. No undesirable residues were detectable on the photoresist images or the exposed developed areas after thorough washing with deionized water.

EXAMPLE 2

A photoresist solution essentially consisting of 16 parts of a poly-(p-hydroxystyrene) having a mean molecular weight of 25,000 ($\overline{M}_n$ from GPC) as an alkali-soluble binder and 4 parts of tris-(4-tert-butoxycarbonyloxyphenyl)-sulfonium hexafluoroarsenate as a photoactive component and 80 parts of methylpropylene glycol acetate as a solvent was applied by spin coating to surface-oxidized silicon wafers in a layer thickness of 1.0 μm and heated for 1 minute at 90° C. Exposure of the coated and predried silicon wafers through the transmission mask was carried out using short-wavelength UV light of wavelength 248 nm, by the contact process under reduced pressure. Following thermal aftertreatment for 1 minute at 100° C., the silicon wafers could be developed in 20% strength N-(2-hydroxyethyl)-piperidine solution of pH 12.4.

The following residual layer thicknesses were obtained after this development and the cleaning process with deionized water:

| Exposure energy [mJ/cm²] | Residual layer thickness [%] |
|---|---|
| 1.75 | 98.6 |
| 8.75 | 99.9 |
| 17.50 | 70.65 |
| 21.00 | 48.3 |
| 24.5 | 35.2 |
| 28.0 | 21.1 |
| 31.5 | 0 |
| 35.0 | 0 |
| 70 | 0 |

The layer thicknesses were measured using an α-step profilometer from Tencor.

The investigations carried out subsequently under the scanning electron microscope showed very well developed 0.75 μm wide structures having a very steep edge profile. Furthermore, residues on the wafer, which are undesirable in semiconductor production, were not detectable.

If commercial developers based on alkali metal hydroxides or tetraalkylammonium hydroxides are used, the surface of the resist images is strongly attacked and the profiles produced are unsuitable for further structure transfer (for example etching).

We claim:

1. A method for developing a positive-working photoresist based on novolak/o-quinonediazide, the resist being applied to a substrate, exposed imagewise and brought into contact with developer solution to form the positive resist image, wherein the developer solution used is an aqueous developer solution, which contains one or more water-soluble basic compounds, wherein the said compound is a compound of the formula (I)

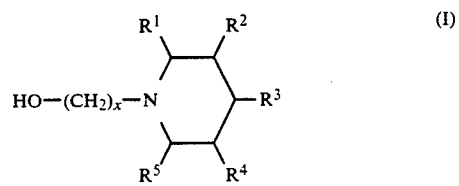

where $R^1$ to $R^5$ are identical or different and are each H, OH, hydroxyalkyl of 1 to 4 carbon atoms, alkoxy of 1 to 4 carbon atoms or alkyl of 1 to 4 carbon atoms and x is from 1 to 5.

2. A method for developing a positive-working photoresist based on novolak/o-quinonediazide, the resist being applied to a substrate, exposed imagewise and brought into contact with developer solution to form the positive resist image, wherein the developer solution used is an aqueous developer solution as set forth in claim 1.

3. A method for developing a positive-working photoresist based on novolak/o-quinonediazide, the resist being applied to a substrate, exposed imagewise and brought into contact with developer solution to form the positive resist image, wherein the developer solution used is an aqueous developer solution as set forth in claim 1.

4. A method for developing a positive-working photoresist based on poly-(p-hydroxystyrene)/sulfonium salt, the resist being applied to a substrate, exposed imagewise and brought into contact with developer solution to form the positive resist image, wherein the developer solution used is an aqueous developer solution set forth in claim 1.

5. A method for developing a positive-working photoresist based on poly-(p-hydroxystyrene)/sulfonium salt, the resist being applied to a substrate, exposed imagewise and brought into contact with developer solution to form the positive resist image, wherein the developer solution used is an aqueous developer solution as set forth in claim 1.

* * * * *